United States Patent [19]

Fujimori

[11] Patent Number: 5,654,711
[45] Date of Patent: Aug. 5, 1997

[54] ANALOG-TO-DIGITAL CONVERTER WITH LOCAL FEEDBACK

[75] Inventor: Ichiro Fujimori, Austin, Tex.

[73] Assignees: Asahi Kasei Microsystems Ltd., Tokyo, Japan; Oasis Design Inc., Austin, Tex.

[21] Appl. No.: 486,690

[22] Filed: Jun. 7, 1995

[51] Int. Cl.$^6$ .................................................. H03M 3/00
[52] U.S. Cl. ........................................ 341/143; 341/155
[58] Field of Search ................................. 341/143, 172, 341/155

[56] References Cited

U.S. PATENT DOCUMENTS

| | | |
|---|---|---|
| 4,851,841 | 7/1989 | Sooch . |
| 4,920,544 | 4/1990 | Endo et al. . |
| 5,061,928 | 10/1991 | Karema et al. . |
| 5,148,166 | 9/1992 | Ribner . |
| 5,148,167 | 9/1992 | Ribner .................................. 341/143 |

OTHER PUBLICATIONS

Franca, et al., "Design of Analog —Digital VLSI Circuits for Telecommunications and Signal Processing", 2nd Edition, Prentice Hall, pp. 251–289.

Hogenauer, "An Economical Class of Digital Filters for Decimation and Interpolation", IEEE Trans. on Acoustics, Speech and Signal Processing, vol. ASSP–29, No. 2 (Apr., 1981).

Chu, et al. "Multirate Filter Designs Using Comb Filters", IEEE Trans. on Circuits and Systems, vol. CAS–31, pp. 913–924 (Nov., 1984).

Moussavi, et al., "High–Order Single–Stage Single–Bit Oversampling A/D Converters Stabilized with Local Feedback Loops", IEEE Trans. on Circuits and Systems, vol. 41, No. 1, pp. 19–25 (Jan., 1994).

Crochiere, et al., "Interpolation and Decimation of Digital Signals —A Tutorial Review", Proc. IEEE, vol. 69, pp. 300–311 (Mar., 1981).

Primary Examiner—Brian K. Young
Attorney, Agent, or Firm—Kevin L. Daffer; Conley, Rose & Tayon

[57] ABSTRACT

An analog-to-digital converter is provided for converting an analog signal to a digital signal and for maintaining a linear gain relationship therebetween, regardless of the analog input signal full scale voltage. The analog-to-digital converter utilizes oversampling and delta-sigma techniques within a cascaded, multiple order circuit arrangement. A local feedback loop is coupled across the output and input nodes of at least one latter order integrator within the first stage and subsequent stage of the cascaded analog-to-digital converter. The local feedback loop monitors the output from the connected integrator and modifies that output through local feedback to ensure the input level of the second and subsequent stages is optimally maintained. Proper scaling of the latter stages ensures that quantization noise caused by the first stage is cancelled, and that any and all direct noise leakage from the first stage does not enter into the digital signal produced by the noise cancellation circuit.

34 Claims, 9 Drawing Sheets

ANALOG-TO-DIGITAL CONVERTER WITH LOCAL FEEDBACK

BACKGROUND OF THE INVENTION

1. Field of the Invention

This invention relates to an analog-to-digital (A/D) converter and more particularly to an oversampled, multiple order modulation portion of the A/D converter. The converter performs noise shaping with minimal signal-to-noise (S/N) degradation over a wide range of input levels.

2. Description of the Relevant Art

Oversampled A/D converters, often denoted as "delta-sigma converters" are well known in the art. Delta-sigma converters have gained in popularity due primarily to their high resolution output and adaptability to mixed-signal VLSI processes. The delta-sigma converter is inherently an oversampling converter, although oversampling is just one of the techniques contributing to the its overall performance. A delta-sigma converter essentially digitizes an analog signal at a very high sampling rate (oversampling) to perform a noise-shaping function. Digital filtering after noise-shaping allows the delta-sigma converter to achieve a higher effective resolution than the analog input signal. Decimation is thereafter used to reduce the effective sampling rate back to the "Nyquist" rate. To gain an understanding of delta-sigma converters it is important to understand the operation of oversampling, noise-shaping, digital filtering and decimation.

FIG. 1 illustrates a conventional second order delta-sigma converter 10. Converter 10 is denoted a second order delta-sigma converter in that an error signal at output Y is integrated twice with respect to time. Accordingly, converter 10 comprises two integrator circuits 12 shown in dashed line. Integrators 12 are connected in series between a first summing node 14 and a quantizer 16. Quantizer 16 (shown as a digitizing analog-to-digital, or "a/d", block) quantizes the analog output signal from the second integrator 12 and produces a digital code at output Y. The quantized output is fed back through a digital-to-analog (denoted as "d/a") converter 18 to amplifiers, denoted in FIG. 1 as having respective gain scaling factors $g_0$ and $g_1$. The outputs of the amplifiers are connected to first summing node 14 as well as second summing node 20.

Output signal Y is fed as digital code to a digital decimation filter 22. Filter 22 functions to filter out quantization noise produced by quantizer 16 and to decimate the sampling frequency back to the original Nyquist rate. Digital filtering is fairly well known, and includes a low pass technique utilizing a finite impulse response (FIR) filter, infinite impulse response (IIR) filter, or a combination of both. Decimation can be included with or separate from the filter. Decimation is incorporated with the filter if the filter output is digitally resampled at a lower rate than the quantizer sampling frequency. In the latter instance, it may not be necessary to compute a filter output for every input sample thereby achieving considerable efficiency in the computational process.

Inclusion of feedback from the digital-to-analog circuit 18 to the first and second nodes 14 and 20, respectively, provides stability to the overall architecture. Circuit 18, the output of which is coupled either directly or through amplifiers to nodes 14 and 20 via feedback, basically functions as a reference voltage selector. Either a positive or a negative reference voltage (either +Vref or −Vref) is selected by circuit 18 in accordance with its receipt of a high logic level or low logic level, respectively. Selector 18 thereby forwards an appropriate reference voltage to summing nodes 14 and 20 in accordance with the corresponding logic value of digital output signal Y.

Conventional delta-sigma modulators often cannot convert a full-range of analog input voltages. As shown in FIG. 2, as the analog input signal X approaches full scale (i.e., 0.0 dB), noise is injected into the feedback loop due to the non-linear behavior of quantizer 16. Specifically, as the input signal X approaches peak value, quantizer 16, which is essentially a comparator with gain, begins to enter a non-linear state. Non-linearity is caused primarily from an increase in quantizer 16 input while reference feedback levels output from circuit 18 remains fixed. That is, the gain of quantizer 16 comparator undergoes non-linear operation relative to fixed output and input level increases. A non-linear response at high input values causes the feedback loop to operate in what is often called an "overload" condition. Overload is defined herein as a property of a delta-sigma converter resulting from failure of the quantized output data to follow increases in analog input values through negative feedback. As quantizer 16 input is increased, the quantizer gain will appear smaller due to its limited output levels (±Vref). At some input level exceeding a threshold overload amount, linear operation of delta-sigma converter cannot be maintained, causing a degradation of signal-to-noise (S/N) ratio. FIG. 2 illustrates a relatively linear slope 24 which changes to a non-linear slope 26 as the input level is increased toward full scale or peak values. Overload of the feedback loop is illustrated at the point (approximately −6.0 dB) in which linear slope 24 converts to a substantially non-linear curvature 26.

Reduction in comparator gain from a linear model to a non-linear model not only injects unacceptable noise into the feedback loop during peak voltages of the input signal, but it also can cause overall instability of a delta-sigma converter even after the input signal which caused the instability is removed. Many skilled artisans have utilized a reset trigger at the integrator circuits which resets converter operation if loop instability occurs. In addition to, or in lieu of the reset trigger, gain scaling the first order integrator has also been used. Gain scaling the feedback reference voltages to a level above the peak analog input values has been looked to as a way in which to avoid overload by utilizing lower signals within the integrator and quantizer. A description of gain scaling applicable to a first or second order, single stage delta-sigma converter is provided in reference to U.S. Pat. No. 4,851,841 (herein incorporated by reference).

Gain scaling the effective feedback reference voltage to a level exceeding the analog input voltage allows S/N boosting of the converted analog input signal near the extremes of the input signal peak values. Gain scaling the effective feedback reference voltage is illustrated in reference to the following transfer function of output signal Y, indicative of the single loop, second order delta-sigma converter of FIG. 1:

$$Y = XZ^{-2}/g_0 + Q(1-Z^{-1})^2 \qquad \text{(Eq. 1)},$$

where $Z^{-2}$ represents two delay period associated with blocks d of both integrators 12, $1-Z^{-1}$ represents the transfer function of each integrator 12, and $g_0$ represents the scaling factor of the first order amplifier. After decimation, Dout is represented as the following transfer function:

$$Dout = Yg_0 = XZ^{-2} + Q(1-Z^{-1})^{-2}g_0 \qquad \text{(Eq. 2)}$$

If noise is present within the analog input signal, then an analog noise factor appears in equation 2. Application of gain $g_0$ to the analog input will cause an increase in the analog noise factor as well as increase in the quantization noise factor $Q(1-Z^{-1})^{-2}$. Presence of gain scaling factor $g_o$ is therefore beneficial in avoiding overload but at the expense of increased quantization noise and/or analog noise forwarded to the digital output signal Dout.

Modern day delta-sigma converters attempt to minimize overload by utilizing what is often called a cascaded arrangement. A cascaded delta-sigma converter is defined as a converter having more than one stage of single or multiple-order integrators coupled together. FIG. 3 illustrates a second order stage 30 coupled in cascade with a subsequent first order stage 32 to form a cascaded 2:1 delta-sigma converter 33. Coupled between second order stage 30 and first order stage 32 is an interstage summing node 34. Summing node 34 is configured to receive a scaled down analog signal from amplifier 36 and a selectively amplified analog output from amplifier 38. The scaling of amplifier 36 can be designed having a scaling coefficient which is an inverse product of scaling coefficients within amplifiers 40a and 40b. Additionally, amplifier 38 can be designed to receive programmable instructions which define an amplification coefficient which allows interstage summing node 34 to produce (i) only analog data (i.e., data at input of quantizer 16) from first stage 30 absent quantized noise, (ii) only the quantized noise absent analog data from first stage 30, or (iii) a combination of data and noise.

Amplifier 42 at the output from interstage summing node is preferably configured with a scaling factor less than one. As a result, the level of data, noise, or both, applied to the input of the subsequent stage 32 is maintained at a level necessary to minimize overload of stage 32. Reducing the input level to the second stage causes the second stage, namely the second integrator and associated quantizer 44, to operate in a more linear range. Even if the first stage utilizes its entire dynamic range, the level of signal forwarded from amplifier 42 is maintained at a relatively low level so as not to exceed the feedback voltage levels sent by reference voltage selector (i.e., digital-to-analog converter) 46.

FIG. 4 illustrates a noise cancellation circuit 50 designed to receive the digital outputs $Y_1$ and $Y_2$ at each respective output of stages 30 and 32. A delay circuit 52 is coupled to receive output $Y_1$. Delay circuit 52 functions to time delay data of $Y_1$ relative to data of $Y_2$, as presented to summing node 54. A quantized, differentiated signal $Y_2$ is produced at the output of differentiator unit 60. Differentiator unit 60 comprises two series-connected digital differentiators, which in a manner known in the art, differentiates the digital difference signal from summing node 62. The output from digital differentiator 60 is added via summing node 54 to the output of delay circuit 52 as digital code at output Y. Digital signal Y represents a digital code of a high-speed digital bit pattern forwarded at the same frequency at which the quantizer circuits 16 and 44 are clocked. The relative number of logic 1s to logic 0s output by signal Y is indicative of the polarity and voltage magnitude of analog input signal X.

The form and function of cascaded 2:1 delta-sigma converter 33 and associated noise cancellation circuit 50 of FIGS. 3 and 4 are described in reference to U.S. Pat. Nos. 5,148,166 and 4,920,544 (herein incorporated by reference). As described in each of the above U.S. Patents, at least two reasons for implementing a cascaded arrangement, with appropriate noise cancellation, are to remove the quantizing noise generated by the first stage 30 and to increase noise shaping orders for the quantization noise of the second stage. Scaling the output of the interstage summing node 34, alleviates overload problems generally associated with many non-cascaded configurations. The cascaded configuration thereby achieves the advantages associated with gain scaling the first order input of the first stage. Unfortunately, however, the aforesaid cascaded arrangement by itself cannot completely eliminate overload during times in which the input analog signal X is at or near full scale values.

FIGS. 5 and 6 illustrate a cascaded 2:2 delta-sigma converter 70 with associated noise cancellation circuit 72. Converter 70 is similar to the cascaded 2:1 delta-sigma converter 31 of FIG. 4; however, converter 70 includes, within the second stage 74, two integrators instead of one. The second order second stage 74 is therefore similar to the second order first stage 76. Shown with similar reference numeral to that of FIG. 3, interstage summing node 34 includes amplifiers 36 and 38 which input a scaled signal to summing node 34. An output amplification is carried out by amplifier 42, preferably at a scaling factor less than 1, and in many instances, less than ½. The quantized signals $Y_1$ and $Y_2$ are fed into noise cancellation circuit 72 shown in FIG. 6, with delay circuit 52, summing node 54 and differentiator 60 shown with like reference numerals to that of FIG. 4.

The combination of converter 70 and noise cancellation circuit 72 produces the following transfer characteristic at output signal Y:

$$Y = XZ^{-4} + (1-Z^{-1})^4 Q_2/hc1 \qquad \text{(Eq. 3)},$$

where $Z^{-1}$ represents four delay periods associated with blocks 78 and 80 of FIG. 5 and dual delay circuit 52 of FIG. 6. $1-Z^{-1}$ represents a first order noise shaping function within converter 70; $Q_2$ represents the quantization noise introduced by quantizer 44; and, hc1 represents the gain scaling factor of amplifier 42 (interstage summing node 34 output). Quantization noise introduced by quantizer 16 is eliminated by use of noise cancellation circuit 72. The gain scaling coefficient (or factor) of amplifier 42 is denoted as hc1. The transfer functions of delay circuits associated with integrators and the integrators themselves are of common knowledge to a skilled artisan and set forth in the U.S. Pat. No. 5,061,928 (herein incorporated by reference).

Overload performance of a cascaded loop such as a 2:1, or 2:2 cascaded arrangement, is generally better than a non-cascaded, single loop. Accordingly, the arrangement shown in FIGS. 3 and 5 provide a significant improvement over the arrangement shown in FIG. 1. A cascaded converter performs over a wider dynamic range regardless of a whether the first stage is overloaded, provided the latter (second) stage is not overloaded. Any overloaded quantization noise of the first stage will be cancelled by the noise cancellation circuit 50 or 72. In order to minimize the possibility of overloading the second stage, the gain scaling factor (hc1) of amplifier 42 is made very small, preferably less than 1, and in many instances less than ½. By making the gain scaling factor small, overload is minimized, however, at the expense of S/N ratio. The transfer function for the digital output signal Y of equation 3 bears this result. FIG. 7 illustrates S/N plotted as a function of input level for a cascaded 2:1 arrangement, such as that shown in FIG. 3. A reduction in interstage gain scaling indicates an improvement in overload performance, but at the expense of a lower S/N ratio. For example, an interstage gain scaling of hc1=⅛ results in a linear range closer to full scale (0.0 dB) than the other, larger gain scaling factors. However, a gain scaling factor of ⅛ produces a lower S/N than the other gain scaling factors. By gain scaling the analog input voltage with a gain scaling factor $g_0$, similar to that described in U.S. Pat. No. 4,851,841, for a cascaded 2:1 arrangement, the transfer function of output signal Y is as follows:

$$Y = XZ^{-3}/g_0 + (1-Z^{-1})^3 Q_2/hc1 \quad \text{(Eq. 4)}$$

After decimation and gain compensation of $g_0$, the decimator output Dout will be as follows:

$$D_{out} = g_0 Y = XZ^{-3} + g_0(1-Z^{-1})^3 Q_2/hc1 \quad \text{(Eq. 5)}$$

Adding magnitude to the input gain scaling factor $g_0$, adds to the quantization noise factor. As such, equation 5 illustrates the negative effect of $g_0$ upon S/N ratio.

In an attempt to offset the S/N degradation associated with a fractional interstage gain scaling, a cascaded 2:2 converter 70 can be employed having the response shown in FIG. 8. Similar to FIG. 7, FIG. 8 represents a simulated output response of signal Y for various input levels of signal X. FIG. 8 indicates an improvement in overload performance with corresponding decrease in interstage gain scaling hc1, yet at the expense of S/N ratio. A comparison of FIG. 8 to FIG. 7 illustrates an advantage in using a cascaded 2:2 arrangement. Specifically, a cascaded 2:2 converter achieves significantly higher S/N ratios for a given interstage gain scaling factor. Given a smaller interstage gain scaling factor, a cascaded 2:2 arrangement can achieve better overload performance. For example, the cascaded 2:2 architecture indicates in FIG. 8 a linear roll-off (i.e., overload) at −2.0 dB input level when configured with a ⅛ interstage scaling factor. While S/N and overload performance is significantly improved in a cascaded 2:2 arrangement, overload nonetheless still remains near input peak values.

Regardless of the delta-sigma configuration, whether it is a single stage with input gain scaling, a cascaded 2:1 modulator with interstage gain scaling and noise cancellation, or a cascaded 2:2 converter with interstage gain scaling and noise cancellation, the result remains the same: a converter which overloads at analog input voltages approaching the peak or full scale value. FIGS. 2, 7 and 8 all shown overload prior to input signal X achieving full scale. For example, if the analog input value reaches a voltage substantially near the reference voltage, a conventional converter will change from a linear operation to a non-linear operation. To further clarify, using an exemplary +3.0 v. Vref and −3.0 v. Vref feedback level, an analog input level approaching the peak voltages (e.g., exceeding in absolute value ±2.9 v.) of Vref will cause the converter to experience an overload condition regardless of the converter configuration. Attempts to alleviate the overload by gain scaling the feedback Vref voltage or fractionally scaling the interstage gain merely reduces the S/N ratio as a trade off to improved overload performance. It would be desirable to further enhance overload performance but not to the detriment of S/N ratio. Thus, improvements to conventional converters entail a configuration which does not enter overload prior to the analog input signal achieving peak value. Of further importance is the desire for a configuration which maintains a high S/N ratio throughout the dynamic range of the converter, having an input signal which can extend up to and possibly beyond the peak value level of the feedback reference voltages.

SUMMARY OF THE INVENTION

The problems outlined above are in large part solved by an improved converter configuration of the present invention. That is, the delta-sigma converter hereof utilizes a local feedback arrangement which selectively controls a local integrator circuit placed subsequent to an initial integrator circuit. The local feedback arrangement is thereby used not necessarily in the first integrator but in an integrator subsequent to the first integrator, i.e., in the second order integrator in a cascaded 2:x configuration, in the second and/or third order integrator in a cascaded 3:x configuration, etc. Thus, the local feedback is preferably not placed on the first order integrator first stage. The local feedback is used to control the output of the local integrator by use of a negative local feedback that includes an individual quantizer.

Broadly speaking, the present invention contemplates a delta-sigma modulator. The delta-sigma modulator, includes first and second integrators coupled in series between an analog input node and an analog output node. A first summing node is coupled between the analog input node and the first integrator. A second summing node is coupled between the first integrator and a second integrator. A local feedback loop is coupled preferably only between the analog output node and the second summing node. The local feedback loop comprises a first quantizer coupled in series with a first reference voltage selector. A multiple order feedback loop (or global feedback loop) may be coupled between the analog output node and an input of the delta-sigma modulator, preferably the first summing node. The global feedback loop may also be coupled between the analog output node and, if desired, both the first and second summing nodes. The multiple order feedback loop comprises a second quantizer coupled in series with a second reference voltage selector. The multiple order feedback loop is dissimilar from the local feedback loop, wherein the multiple order feedback loop feeds back upon the summing nodes preceding the first and second integrators. Conversely, the local feedback loop merely takes the output of one integrator and feeds back to a summing node preceding that integrator, but no other integrators.

The present invention further contemplates a multiple order, cascaded analog-to-digital converter. The analog-to-digital converter includes a first stage of at least two primary integrators electrically coupled in series between an analog input node and a first analog output node. At least one local feedback loop is coupled across a respective primary integrator except for the primary integrator on which the analog input node is coupled thereto. In other words, a local feedback loop is coupled across each of the primary integrators except for the first order integrator. The primary integrator which receives the local feedback loop is the second order, third order, etc. integrator of the first stage. If desired, a local feedback loop can be arranged across various integrators of the second stage as well. A second stage of at least one secondary integrator is electrically coupled between the first analog output node and a second analog output node. A noise cancellation circuit is coupled to receive, during use, a quantized signal forwarded from the local feedback loop (or loops), forwarded from the first analog output node, and forwarded from the second analog output node.

The present invention still further contemplates a method for minimizing decrease in signal-to-noise level of a digital code output from a cascaded analog-to-digital converter. The method includes the steps of providing at least two integrators for integrating an analog input signal to produce an integrated analog output signal. The integrated analog output signal is then quantized. The quantized analog signal is thereafter fed back to a local feedback switching circuit coupled at the input to one or more integrators configured not as the first order integrator. Feedback of the quantized analog output signal is also directed to a multiple order feedback switching circuit coupled at the input of each integrator.

BRIEF DESCRIPTION OF THE DRAWINGS

Other objects and advantages of the invention will become apparent upon reading the following detailed description and upon reference to the accompanying drawings in which.

Figure 1:
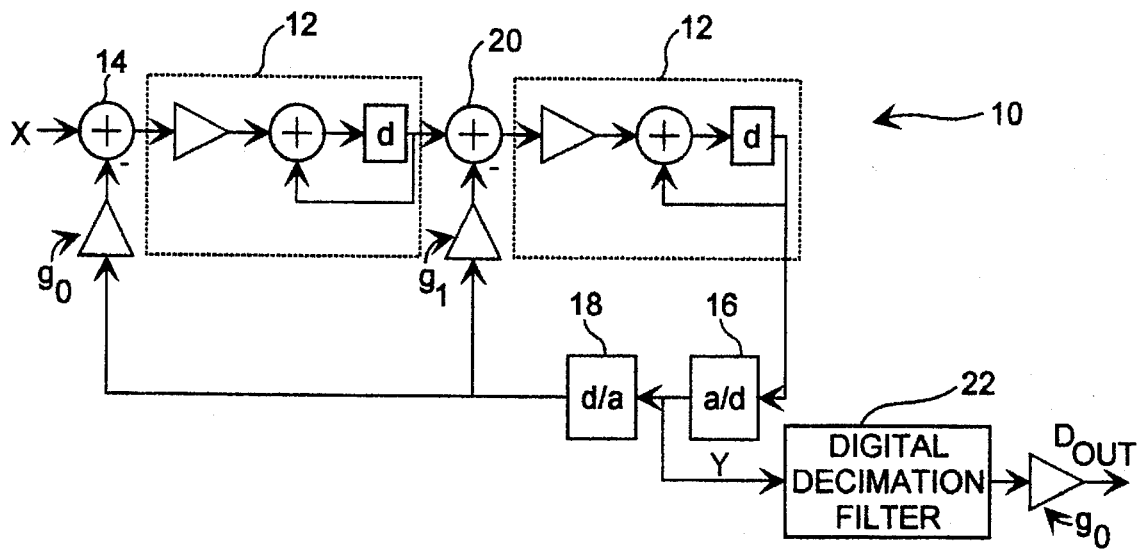
FIG. 1 is a block diagram of a single stage, second order delta-sigma A/D converter of conventional design.
Figure 2:
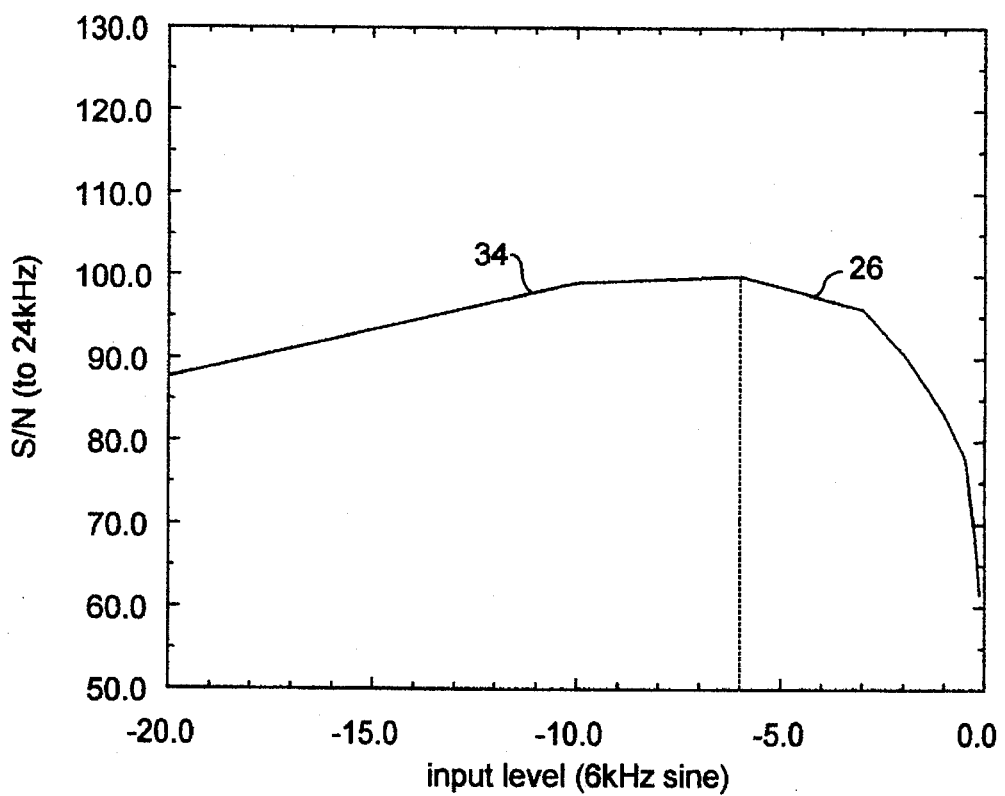
FIG. 2 is a graph of S/N plotted as a function of the analog input level for the converter shown in FIG. 1.
Figure 3:
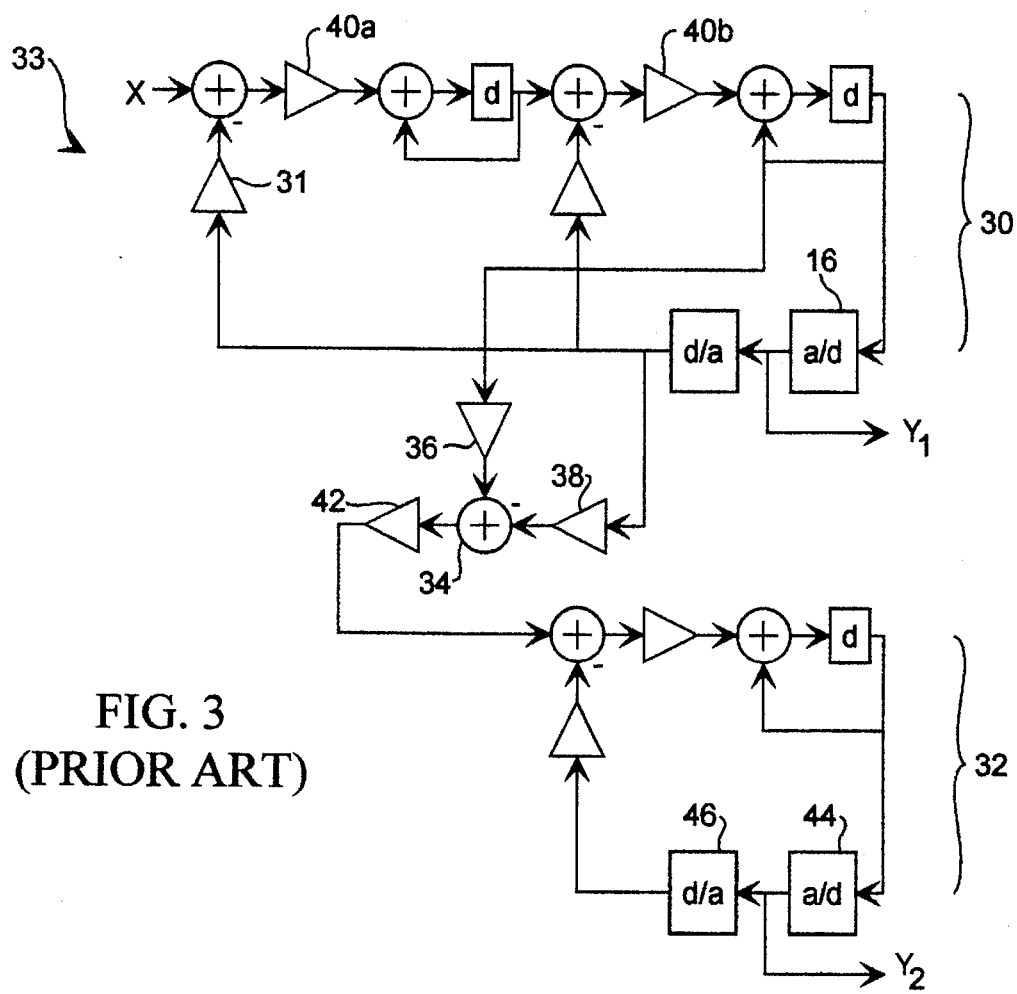
FIG. 3 is a block diagram of a cascaded 2:1 delta-sigma A/D converter having a second order first stage and first order second stage of conventional design.
Figure 4:
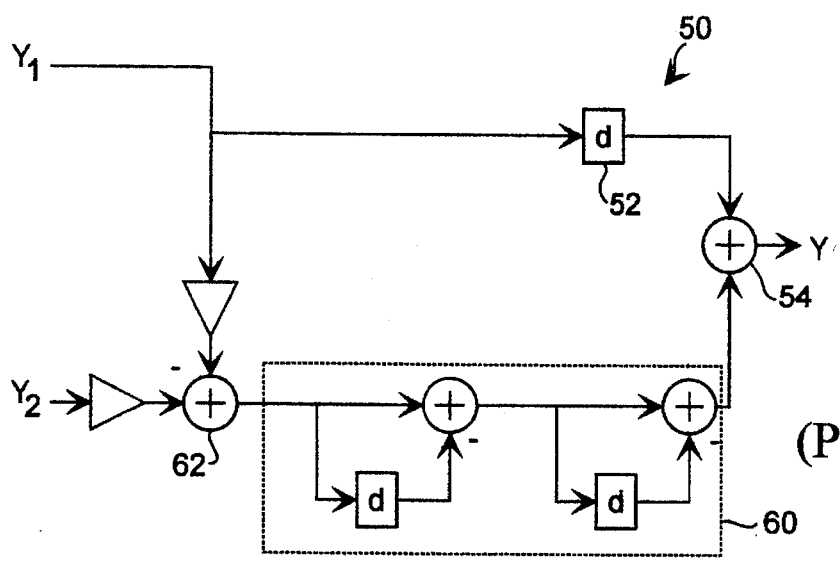
FIG. 4 is a block diagram of a noise cancellation circuit used in conjunction with the converter shown in FIG. 3.
Figure 5:
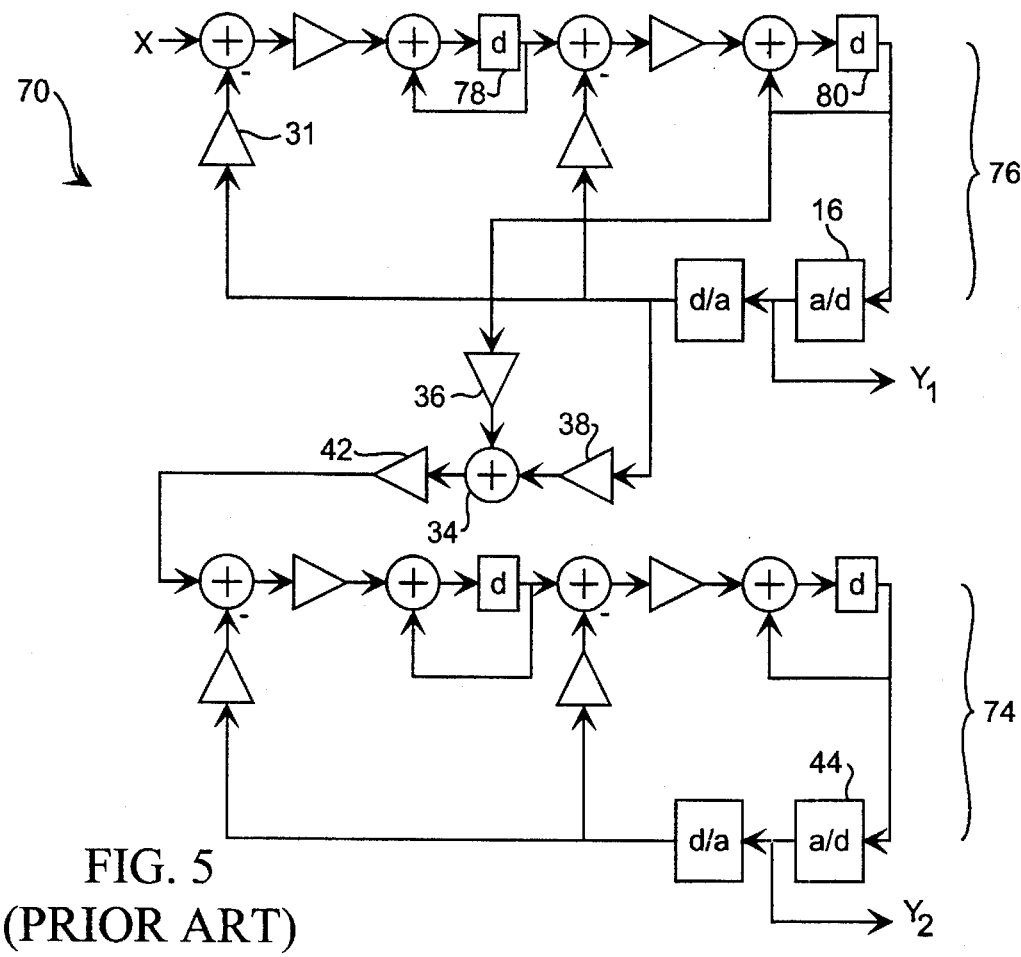
FIG. 5 is a block diagram of a cascaded 2:2 delta-sigma A/D converter having a second order first stage and a second order second stage of conventional design.
Figure 6:
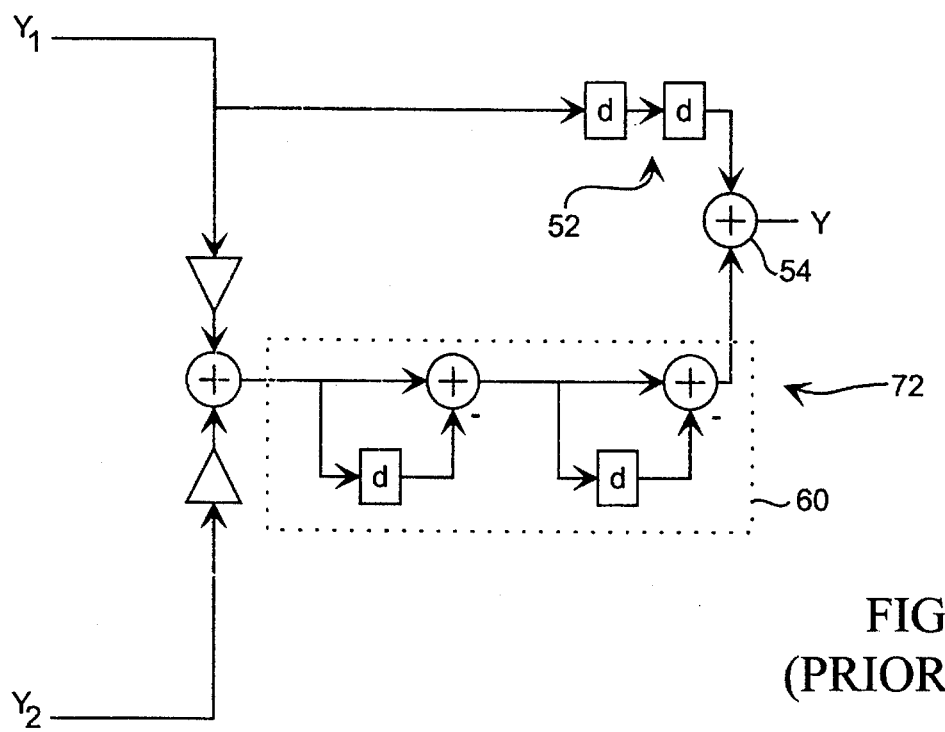
FIG. 6 is a block diagram of a noise cancellation circuit used in conjunction with the converter shown in FIG. 5.
Figure 7:
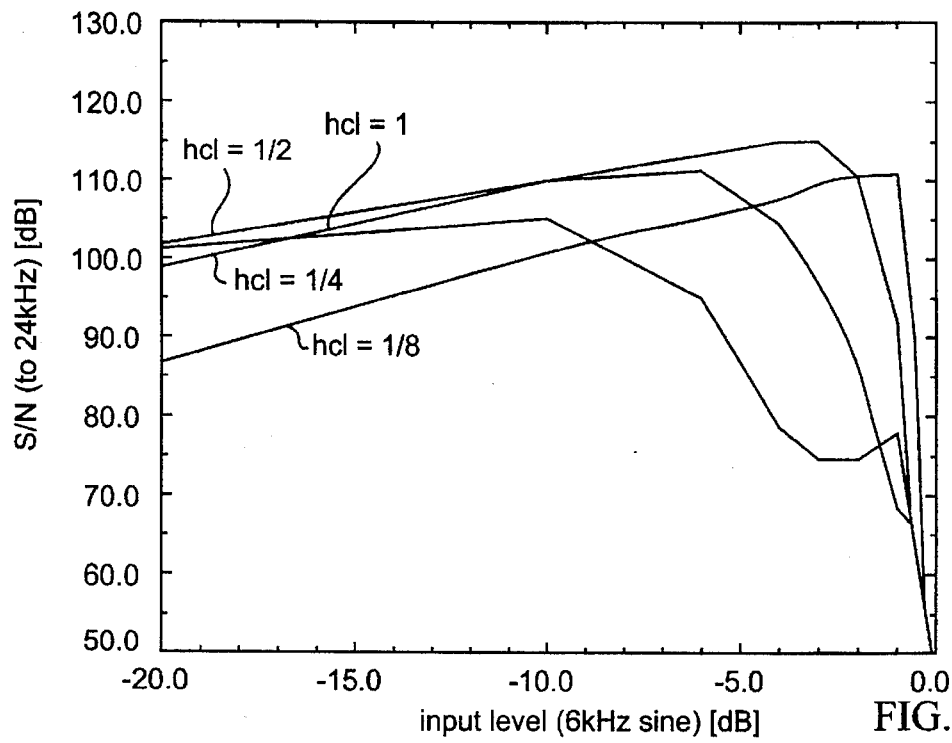
FIG. 7 is a graph of S/N plotted as a function of analog input level and interstage gain scaling for the converter and noise cancellation circuit shown in FIGS. 3 and 4.
Figure 8:
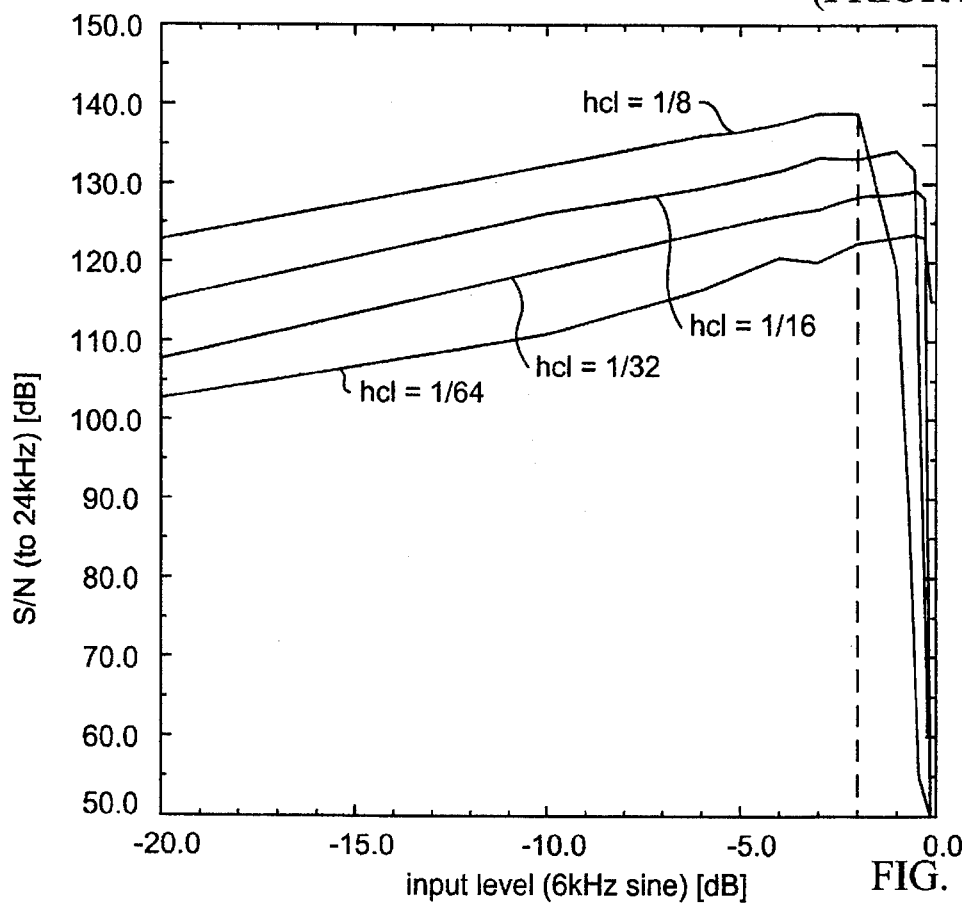
FIG. 8 is a graph of S/N plotted as a function of analog input level and interstage gain scaling for the converter and noise cancellation circuit shown in FIGS. 5 and 6.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

To ensure stable operation and minimize instances of overload, it is necessary that feedback loops beyond conventional feedback loops be used. Namely, the present invention is directed to a supplemental feedback loop (or local feedback loop). The local feedback loop be used in addition to the conventional multiple order (or global) feedback loop associated with all delta-sigma converters.

The local feedback loop is defined as a feedback loop which extends from the output of an integrator back to the input of that same integrator. Thus, a local feedback loop does not extend from the output of one integrator to a prior-connected, other integrator as is normally the case in a global feedback loop.

A local feedback loop is derived from the shortcomings associated with a global feedback loop that includes multiple orders of integrators. Delta-sigma modulators which rely solely upon a global feedback loop is more susceptible to overload near inputs close to full scale. This is because of the multiple order integration of the analog signal that makes the input of the quantizer grow more rapidly in correspondence to the increase of input level.

Figure 9:
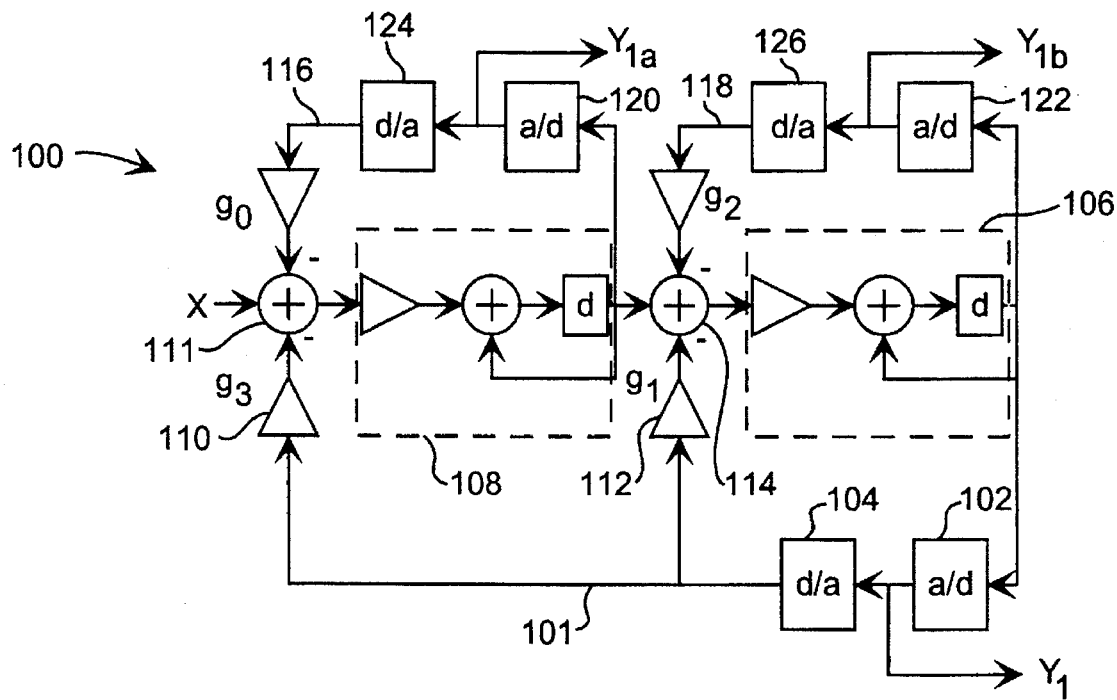
FIG. 9 is a block diagram of a single stage, second order delta-sigma A/D converter having a local feedback loop provided for each order.

Referring now to FIG. 9, a single stage delta-sigma A/D converter is shown having both global feedback and local feedback loops. A global feedback loop is of conventional design and is denoted as reference numeral 101. Global feedback loop 101 includes quantizer 102 and a digital-to-analog circuit (or bi-level reference voltage selector) 104. Quantizer 102 and reference voltage selector 104 are coupled between the output of integrator 106 and the input of two amplifiers 110 and 112. At the input of first integrator 108 is a first summing node 111, and at the input of the second integrator 106 is a second summing node 114. A first local feedback loop 116 is coupled from the output of first integrator 108 to first summing node 111. Additionally, a second local feedback loop 118 is coupled between the output of second integrator 106 and second summing node 114. First local feedback loop 116 and second local feedback loop 118 each include an analog-to-digital (quantizer) circuit 120 and 122, respectively, and further include a digital-to-analog (reference voltage selector) 124 and 126, respectively.

Figure 10:
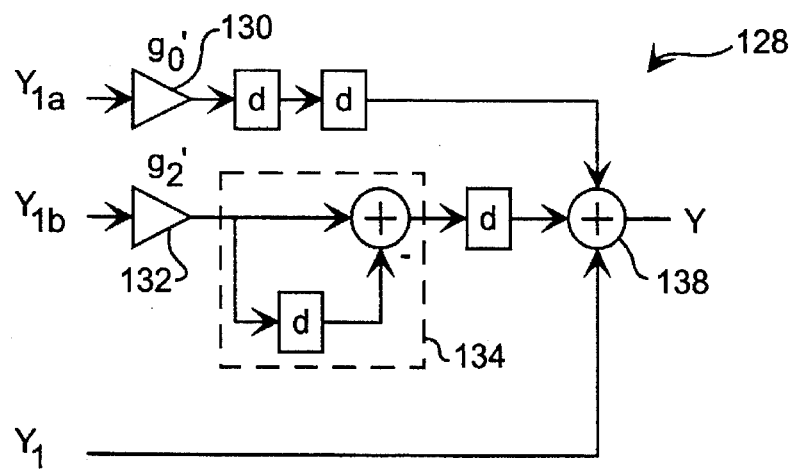
FIG. 10 is a block diagram of a noise cancellation circuit used in conjunction with the converter shown in FIG. 9.

The purpose of using a local feedback on each integrator is to maintain the coresponding integrator's output voltage within a certain range so that the global feedback loop will not overload. Each local feedback loop 116 and 118 prevent associated individual integrators from saturating such that the output voltages of respective integrators are within the proper bounds. Accordingly, individual integrators 106 and 108 are tested continuously during operation. If the integrator outputs exceed the proper bounds, corresponding integrators are returned to their normal operating range by means of signals sent across first and second local feedback loops 116 and 118. The quantizer outputs of both local feedback loops are sent to a noise cancellation circuit as shown in FIG. 10. The noise cancellation circuit of FIG. 10 indicates two amplifiers 130 and 132 coupled to receive respective quantized signals $Y_{1a}$ and $Y_{1b}$ within each local feedback loop. Noise cancellation circuit 128 further includes a differentiator circuit 134 coupled to the output of amplifier 132, and a series of delay circuits, d, coupled to the output of amplifier 130 as well as differentiator 134. Delay circuits are necessary to maintain a synchronized signal at the input of noise cancellation summing node 138.

The operation of delta-sigma A/D converter 100 and noise cancellation circuit 128 is best described in reference to an overall transfer function. Specifically, the transfer function representing digital output signal $Y_1$ is as follows:

$$Y_1 = XZ^{-2} + (1-Z^{-1})^2 Q_1 - g_0 Z^{-2} Y_{1a} - g_2(1-Z^{-1})Z^{-1}Y_{1b} \quad \text{(Eq. 6)},$$

where $(1-Z^{-1})^2$ represents a second order noise shaping function of series-connected integrators 106 and 108. Each local feedback loop 116 and 118 includes a respective amplification factor $g_0$ and $g_2$ used to scale the front end of the corresponding integrator. Additional amplification factors are present at amplifiers 110 and 112, denoted as $g_3$ and $g_1$, respectively. The above equation 6 is derived by designating amplification factor $g_3$ to one (1) and amplification $g_1$ to two (2). Given the above-described global feedback loop 101 amplification factors $g_1$ and $g_3$, and from equation 6, quantization noise within signal $Y_{1a}$ is directly fed to output signal $Y_1$, whereas quantization noise within signal $Y_{1b}$ is fed through a noise shaping transfer function denoted as $1-Z^{-1}$. Noise cancellation circuit 128 receives the signals presented at $Y_{1a}$, $Y_{1b}$ and $Y_1$ and produces a noise cancelled digital output signal Y. The transfer function representative of noise cancellation circuit 128 is shown in a simplified form as follows:

$$Y = Y_1 + g_0' Z^{-2} Y_{1a} + g_2' Z^{-1}(1-Z^{-1}) Y_{1b} \quad \text{(Eq. 7)},$$

where $1-Z^{-1}$ represents the first order noise shaping function, $Z^{-2}$ represents the two delay blocks (or time periods) at the output of amplifier 130, and $Z^{-1}$ represents the delay block at the output of integrator 134. Substituting $Y_1$ transfer function of equation 6 into equation 7 presents the following transfer function:

$$Y = XZ^{-2} + (1Z^{-1})^2 Q_1 - g_0 Z^{-2} Y_{1a} - g_2(1-Z^{-1})Z^{-1} Y_{1b} + + g_0' Z^{-2} Y_{1a} + g_2' Z^{-1}(1-Z^{-1}) Y_{1b} \quad \text{(Eq. 8)}$$

As illustrated in equation 8, any mismatch between $g_0$ and $g_0'$ will cause direct leakage of the quantized noise within signal $Y_{1a}$ to Y signal. Conversely, any mismatch between amplification factor $g_2$ and $g_2'$ will cause leakage of the quantized noise component of signal $Y_{1b}$, but only after that signal has been substantially suppressed by a first order noise shaping process (i.e., $1-Z^{-1}$ first order noise shaping).

The basic operation of local feedback loops 116 and 118 used on each integrator within a single stage, multiple order A/D converter is described in reference to an article by Moussavi, et al., "High-Order Single-Stage Single-Bit Oversampling A/D Converters Stabilized with Local Feedback Loops", *IEEE Trans. on Circuits and Systems*, Vol. 41, No. 1, January 1994, pp. 19–25 (herein incorporated by reference). Using a local feedback loop on each integrator, as described in Moussavi et al., is beneficial in preventing overload of the global feedback loop. Provided the non-idealities of each integrator 106 and 108 can be controlled, provided the amplifier scaling factors $g_0$ and $g_2$ properly match with respective scaling factors $g_0'$ and $g_2'$ of the noise cancellation circuit, and further providing the front end switched capacitors of each integrator 106 and 108 properly match the feedback switched capacitors, the single stage, dual local feedback configuration of Moussavi et al. will ideally function and bear the following transfer function:

$$Y = XZ^{-2} + (1-Z^{-1})^2 Q_1 \quad \text{(Eq. 9)},$$

where $Q_1$ represents the quantization error only of quantizer 102. Quantization error $Q_1$, however, is minimized by it receiving a noise shaping second order transfer function $(1-Z^{-1})^{-2}$. Accordingly, in an ideal situation, the digital output signal Y can have very little quantization noise associated with that signal as indicated in equation 9. However, in most instances, an ideal situation cannot be obtained. The ideal transfer function of equation 9 cannot be obtained due in part to semiconductor fabrication process skews, or erroneous design, layout or implementation of converter 100 components. Instead, what normally occurs is that first integrator 108 operates according to non-idealities, regardless of local feedback loop 116. As shown above, non-idealities of amplifier $g_0$ will appear as direct noise leakage upon the digital output Y. To prevent overload in second order single stage configuration, the second and first local feedback loops (feedback loops 118 and 116) must be activated at input levels of approximately −10 dB to full scale (0.0 dB) and −8.0 dB to full scale, respectively. Local feedbacks can only control the output swing of the corresponding integrator. Without the first local feedback, a first order integration function will still remain within the signal path between the analog input and the quantizer. With first order integration of the analog input as the quantizer input, the global loop will still overload. Overload can therefore not be prevented in a second order, single stage configuration without activating the first feedback loop (feedback loop 116). Since quantization noise leakage of the first feedback loop 116 is severe and direct upon digital output Y, only input levels before the activation of the first local feedback loop is considered as the normal operation region. In addition, the presence of the first local feedback will become another analog noise source that will be directly referred to the analog input when implemented by actual circuits. Further details regarding operation regions of the first and second local feedbacks are provided hereinbelow.

Figure 11:
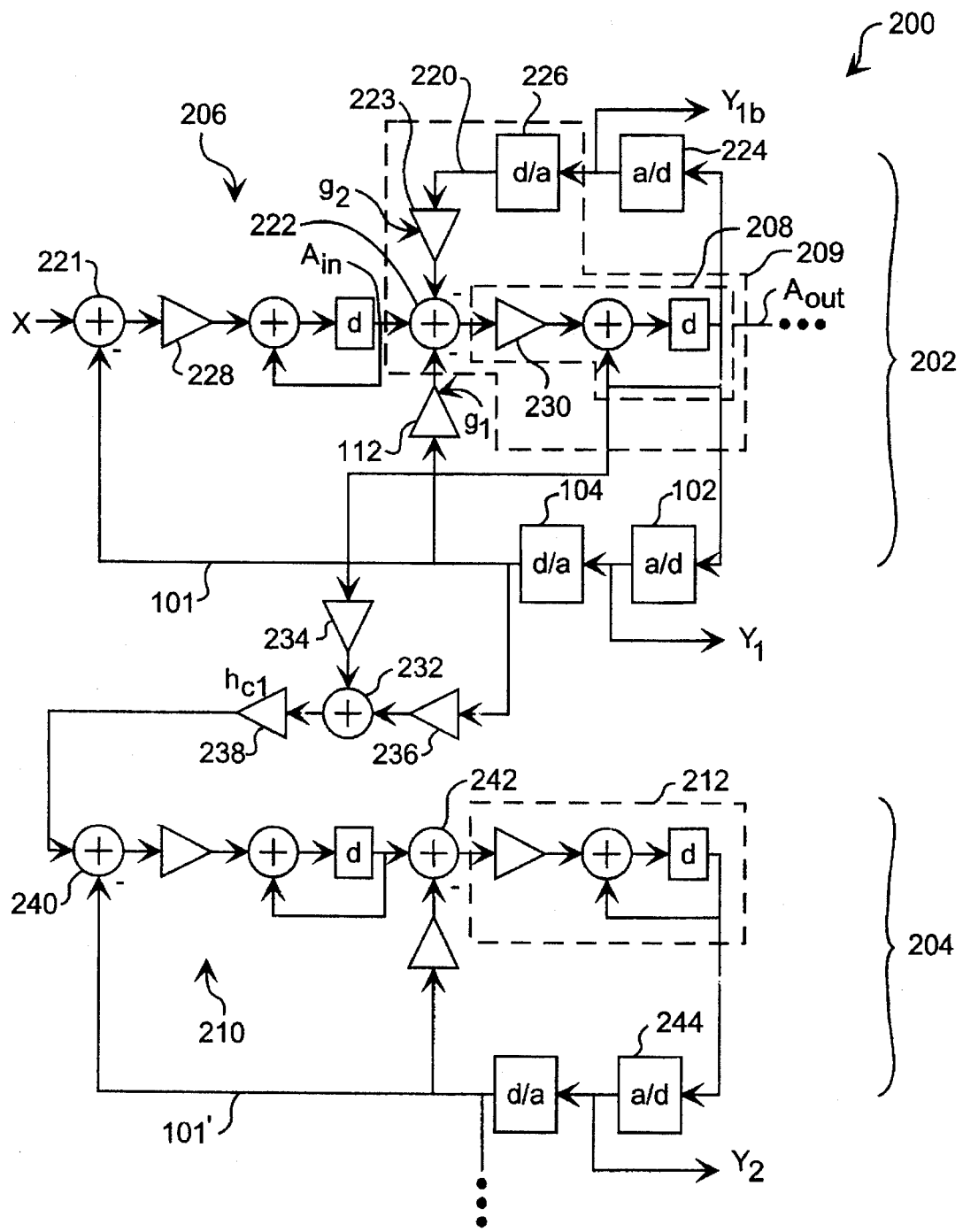
FIG. 11 is a block diagram of a cascaded 2:2 delta-sigma A/D converter having a local feedback loop provided only on the latter order of the first stage.

Turning now to FIG. 11, a block diagram of a cascaded 2:2 delta-sigma A/D converter 200, according to the present invention, is shown. Converter 200 includes first and second stages 202 and 204, respectively. It is understood that stage 202 can include a minimum of two orders of integration, and that stage 204 contains a minimum of one order of integration. According, stage 202 includes first integrator 206 and second integrator 208, whereas stage 204 includes first integrator 210 and second integrator 212. First integrator 206 of stage 202 produces an analog output signal fed to second integrator 208 input. The analog input signal to second integrator 208 is denoted as $A_{in}$. Second integrator 208 produces an analog output signal, denoted as $A_{out}$, which is fed back to a quantizer 102, digital-to-analog circuit 104, and amplifier 112, similar to the configuration set forth in FIG. 9. Amplifier 112 is designed with an amplification scaling coefficient $g_1$, wherein $g_1$ is preferably defined at a coefficient of two (2). Quantizer 102, digital-to-analog circuit 104 and amplifier 112 constitute a global feedback loop 101, similar to that of FIG. 9.

The cascaded arrangement of FIG. 11 purposefully avoids using a local feedback loop (or purposefully avoids using a local feedback loop operable for input signal levels below full scale) between the output of first integrator 206 and the input of first integrator 206 (or first summing node 221 of first integrator 206). Instead, converter 200 of FIG. 11 uses a feedback loop 220 coupled between the output of integrator 208 and the input of integrator 208, via second summing node 222. Local feedback loop 220 includes a quantizer 224 and a digital-to-analog (reference voltage selector) circuit 226. Local feedback loop 220 functions to detect an overload condition at the output of second integrator 208 (or any subsequent order integrator) and create a local feedback signal at the output of selector 226 which feeds back a compensating signal to the input of integrator 208. Quantizer 224 of local feedback loop 220 generates the digital code representative of the compensating signal which maintains the second order integrator output within a desired, specified boundary. By monitoring the output of second integrator 208 and feeding back the quantized signal of the second order integrator, the local feedback loop prevents the integrator output voltage from growing in order to avoid the second stage 204 from entering overload.

The local feedback loop 220 and associated circuitry can be duplicated and used on several orders of integrators within a cascaded analog-to-digital converter. For example, a x:y cascaded converter may have x−1 local feedback loop arranged across each integrator of the first stage. The only order of the first stage which purposefully does not have local feedback is the first order integrator (i.e., the integrator which receives the analog input signal X). All orders of the second stage are designed with local feedback. A local feedback loop is not needed on the first order of the first stage since it is not necessary that overload be eliminated from the first stage. Any quantization noise from the first stage will be cancelled by the noise cancellation circuit. By placing a local feedback loop on subsequent orders of the first stage, and given a proper selection of interstage gain scaling, the second stage is prevented from entering overload. In a x:y:z cascaded converter, x−1 local feedback loops are used on the first stage, y (or y−1) local feedback loop are used on the second stage, and z (or z−1) local feedback loops are used on the third stage, etc.

First stage 202 of FIG. 11 is coupled to second stage 204 by an interstage summing node 232. Summing node 232 is fed by amplified outputs from selector 104 as well as integrator 208. Accordingly, amplifier 234 operates at a scaling factor preferably the product of an inverse ratio of scaling factors for amplifiers 228 and 230. Amplifier 236 operates at a scaling factor of either 0, 1 or 2 depending upon whether summing node 232 forwards to stage 204 data, noise or a combination of data and noise, respectively, from stage 202. The output of interstage summing node 232 is scaled by scaling factor hc1 of amplifier 238. Amplifier 238 scaling factor hc1 is less than one, and preferably less than one half in order to prevent the second stage from overloading without use of a local feedback in the first order integrator of the first stage. Scaled output from summing node 232 is fed to a first summing node 240 of stage 204, along with a global feedback signal within global feedback loop 101'. Second stage 204 is identical in configuration with first stage 202, except that stage 204 does not contain a local feedback loop, such as feedback loop 220 in stage 202. Both first and second stages 202 and 204 utilize unity gain global feedback to first summing nodes 221 and 240. Moreover, scaling to second feedback nodes 222 and 242 is preferably at a scaling coefficient of two. The cascaded arrangement shown in FIG. 11 is illustrative of a 2:2 cascaded converter, however, it is understood that additional orders can be added to the first stage, second stage, or further stages within the overall configuration. Regardless of the configuration, it is important that the first order within the first stage not contain a local feedback loop 220, and each subsequent order contain a local feedback loop. The spirit and scope of the present device thereby contemplates any cascaded arrangement having at least two orders in the first stage, and at least one order in subsequent stages.

Figure 12:
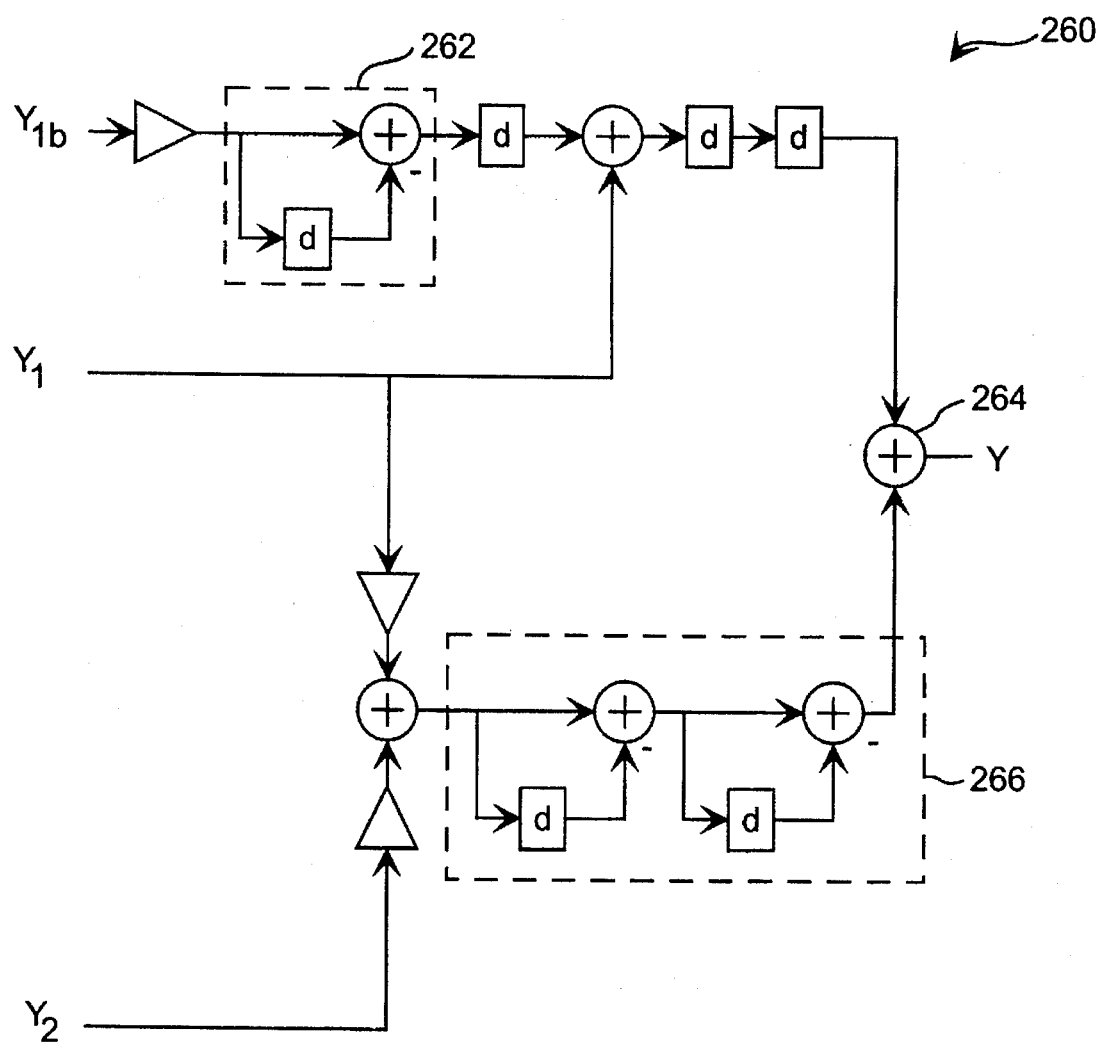
FIG. 12 is a block diagram of a noise cancellation circuit used in conjunction with the converter shown in FIG. 11.

Turning now to FIG. 12, a block diagram of a noise cancellation circuit 260 is shown. Circuit 260 is designed to cancel quantized noise generated by all but the last stage of converter 200. Thus, circuit 260 is used to cancel noise generated by all quantizers within first stage 202. The only remaining noise within digital output signal Y is that of the quantized noise produced in second stage 204, and specifically within quantizer 244. Circuit 260 receives the quantized output signals $Y_{1b}$, $Y_1$ and $Y_2$ from converter 200, wherein the quantized signal within local feedback loop 220 is noise-shaped by differentiator 262 of circuit 260. Various delay circuits designated with a "d" reference are coupled to the output of differentiator 262 to synchronize, in the time domain, input signals into noise cancellation summing node 264. Summing node 264 receives the delayed, differentiated signal from the local feedback loop quantizer 224 and a delayed, double differentiated signal (double differentiated by circuit 266) from the global feedback loop quantizers 102 and 244, and sums the double differentiated global feedback loop output with the singly differentiated local feedback loop output.

Figure 13:
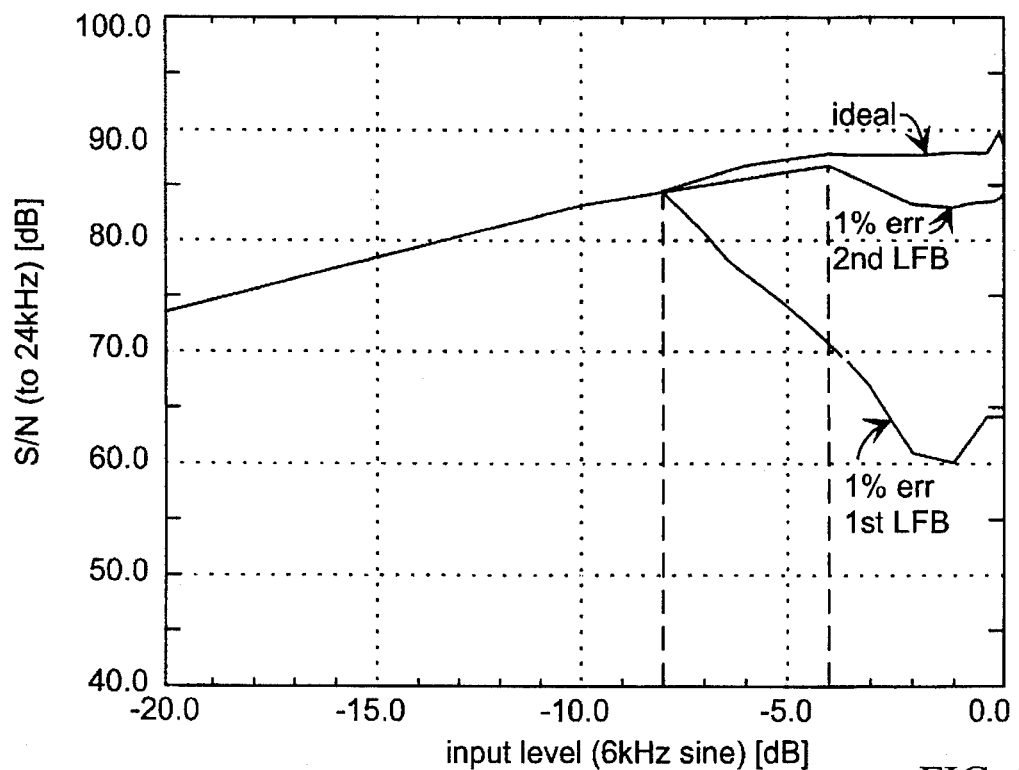
FIG. 13 is a graph of S/N plotted as a function of analog input level for mismatch errors between the local feedback gain coefficient and noise cancellation gain coefficient of the converter and noise cancellation circuit shown in FIGS. 9 and 10.

Referring now to FIG. 13, a graph of S/N plotted as a function of analog signal X input level is shown. FIG. 13 represents simulation of the S/N ratio of a single stage, dual order converter 100 of FIG. 9 coupled with noise cancellation circuit 128 of FIG. 10. The S/N ratio is dependent not only upon the input level, but also upon the mismatch error of scaling factors $g_0$ and $g_2$ of the first and second local feedback loops. A 1.0% mismatch between $g_0$ of the first local feedback 116 of FIG. 9 and $g_0'$ of the noise cancellation circuit amplifier 130 of FIG. 10 is shown in FIG. 13 to cause severe quantization noise leakage problems at an input level of approximately −8.0 dB. A 1.0% mismatch between $g_2$ and $g_2'$ of FIGS. 9 and 10 is shown in FIG. 13 to cause somewhat less severe quantization noise leakage problems at an input level of approximately −4.0 dB. In the first case, mismatch is shown to present S/N vs. input level performance of a single loop.

As shown in FIG. 13, significant increase in noise leakage upon output signal Y occurs if there is any mismatch between amplifier gain scaling coefficients $g_0$ and $g_2$ relative to $g_0'$ and $g_2'$. The first order local feedback 116 of FIG. 9 is shown in FIG. 13 as active at approximately −8.0 dB to full scale. The second order local feedback 118 is active before the first local feedback is active, given a rising input voltage to a peak value. The second local feedback, however, maintains a greater degree of linearity relative to an active first local feedback. The difference is due primarily to direct leakage versus first order quantization noise leakage within the first and second local feedbacks, respectively. The result shown in FIG. 13 is explanatory of the transfer function shown in equation 8. Direct leakage is represented in equation 8 as a transfer function $Z^{-2}$, whereas first order quantization noise is represented as the transfer function $1-Z^{-1}$. A combination of the transfer function shown in equation 8 and the graph of FIG. 13 indicates the importance of the present invention. That is, mismatch errors and their effect upon overload can be substantially eliminated using the configuration of FIGS. 11 and 12. A cascaded converter having only one local feedback at the second order of the first stage substantially eliminates the effect of any direct leakage associated with a first local feedback. By eliminating first local feedback and utilizing only a second (or possibly third, etc.) local feedback, all noise associated with the first stage is cancelled by the cascaded arrangement undergoing noise cancellation. Thus, the present invention prevents overload without the use of a first local feedback loop. This condition is impossible in a single loop (single stage) configuration having multiple local feedback loops. In a cascaded configuration, the quantization noise of the first stage will be cancelled provided the latter stage is not in an overload condition. To prevent overloading the second stage, amplifier 238 in FIG. 11 can be appropriately scaled. Thus, local feedback loop 220 need only prevent overload on the second or subsequent stages by limiting the signal level of the second or subsequent stages.

Figure 14:
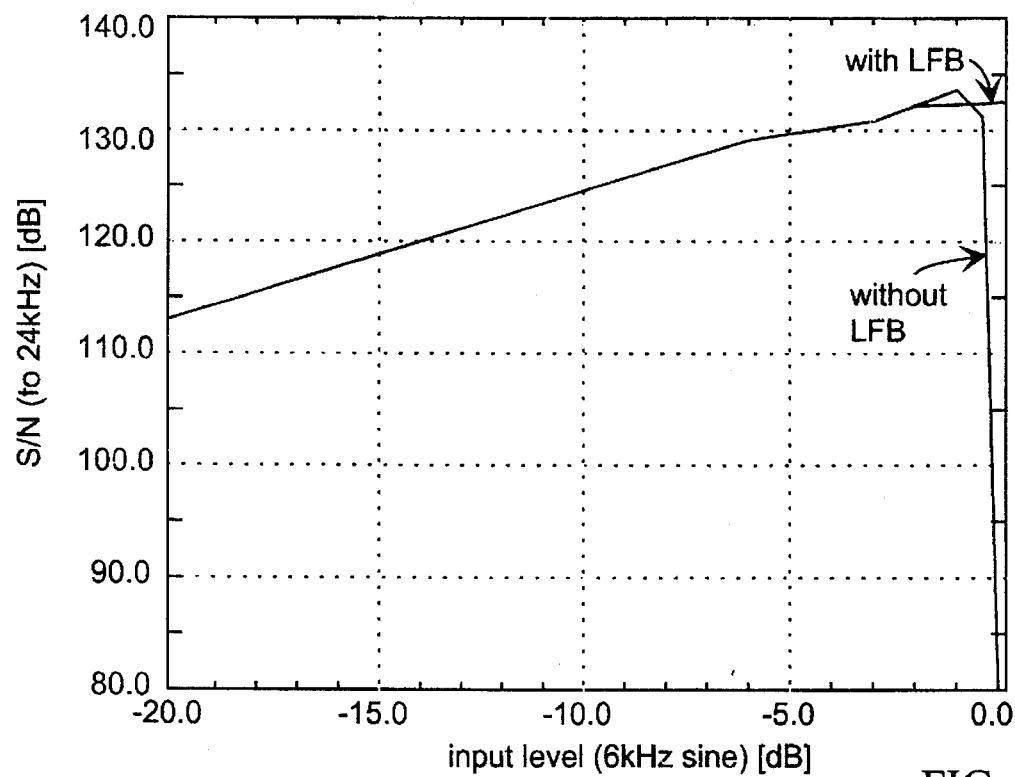
FIG. 14 is a graph of S/N plotted as a function of analog input level, and is dependent upon the presence or absence of local feedback, for the converter and noise cancellation circuit shown in FIGS. 11 and 12.

FIG. 14 illustrates simulation results of what is achieved by having a single local feedback loop of a cascaded 2:2 converter with appropriate noise cancellation, shown in FIGS. 11 and 12. A scaling factor of less than ½ is chosen as the interstage gain scaling factor. FIG. 14 illustrates, for comparison purposes, S/N ratio as a function of input level X both with and without local feedback loop. It is important to note that not only is S/N ratio in FIG. 14 higher than S/N ratio in FIG. 13, but it is further important to note the disparity in S/N ratio dependant upon whether a local feedback loop is or is not used. If local feedback is employed, the S/N ratio maintains a substantially linear slope all the way to full scale (0.0 dB) and beyond. In fact, FIG. 14 shows by way of simulation that overload is not only minimized when local feedback is used, but that overload is effectively eliminated. Still further, the configuration of FIG. 11 achieves the illustrated result in FIG. 14 since $g_0$ and $g_0'$ no longer exists and therefore mismatch and direct noise leakage is no longer possible.

Utilizing a local feedback in the second order (second integrator) of first stage 202 controls the output swing from the second integrator 208 in order to ensure that the resulting output signal does not cause overload of second stage 204. Thus, careful control of the output from the first stage through use of a local feedback can, in many instances, eliminate the constraints of using an extremely small scaling factor with amplifier 238. If the scaling factor (hc1) of amplifier 238 is made too small, the S/N ratio can correspondingly be made too small as well.

The quantizer 224 of local feedback loop 220 of FIG. 11 can be designed as a two level or three level quantizer. It is preferable that quantizer 224 be made a three level quantizer which functions to detect overload and produce one of three corresponding digital levels. Quantizer 224 can thereby be represented as, for example, a window comparator which produces a −1 or +1 depending upon the polarity of the input voltage. When integrator 208 operates within the operating range, quantizer 224 outputs a 0 level such that local feedback loop 220 is not activated. Thus, if integrator output exceed the specified boundaries, the quantizer initiates a proper local feedback signal which forces the integrator to return to the normal operating range through the corresponding three level digital-to-analog circuit 226. The differential architecture of a three level digital-to-analog circuit 226 can be implemented with a high degree of linearity, well known in the art. A three level digital-to-analog circuit is used to minimize noise leakage at small signal inputs by providing primarily zero levels at those input values.

Figure 15:
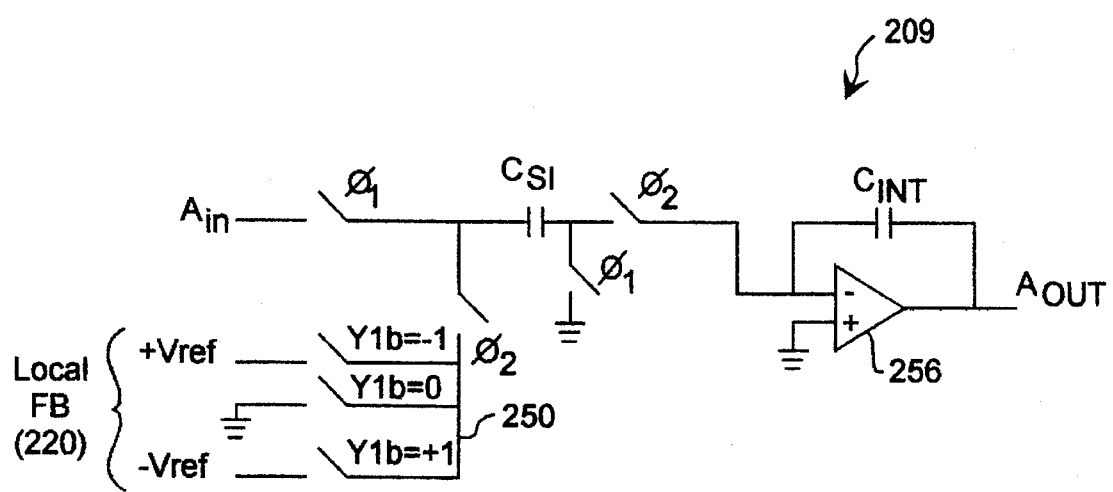
FIG. 15 is a circuit diagram of a the second integrator within the first stage of a cascaded delta-sigma A/D converter having a three level reference voltage selector controlled by the local feedback loop provided in the cascaded delta-sigma A/D converter of FIG. 11.

Turning now to FIG. 15, a circuit diagram is shown of block 209 of FIG. 11. FIG. 15 illustrates switched capacitor implementation of block 209. In a conventional switched capacitor arrangement, two separate switched capacitor branches are required to sample the first integrator output Ain and to implement the three level local feedback D/A 226. If $g_2$ equals one, the same size capacitor can be used for both the sampling of Ain and local feedback. Since the capacitor sizes are identical, this means that with a proper switching scheme, a common (shared) capacitor can be used for both functions. FIG. 15 illustrates a switched capacitor integrator wherein the capacitor for sampling Ain and for implementing the local feedback three level D/A is shared. At $\phi_1$, Ain is sampled on capacitor Cs1. At $\phi_2$, instead of connecting the left side of the capacitor to ground it is connected to ±Vref or 0 depending on the output of local feedback quantizer. By this sequence, the shared capacitor branch will operate the sampling of Ain at $\phi_1$ and three level D/A function at $\phi_2$. The charge corresponding to the difference between Ain and the three level D/A output will be transferred to the integrating capacitor Cint at $\phi_2$. Since the component that determines the gain of Ain sampled and the gain of the three level D/A is common, no mismatch is present. This means that local feedback amplifier $g_2$ is ideal. If so, the effect of the quantization noise leakage of the second local feedback is eliminated.

It will be appreciated by those skilled in the art having the benefit of this disclosure that this invention is believed to be capable of applications with any oversampled analog-to-digital converter. Furthermore, it is also to be understood that the invention shown and described is to be taken as presently preferred embodiments. Various modifications and changes may be made to each and every processing component as would be obvious to a person skilled in the art without departing from the spirit and scope of the invention as set forth in the claims. It is intended that the following claims be interpreted to embrace all such modifications and changes, and according, the specification and drawings are to be regarded in an illustrative rather than a restrictive sense.

What is claimed is:

1. A delta-sigma modulator, comprising:
   first and second integrators coupled in series between an analog input node and an analog output node;
   a first summing node coupled between the analog input node and the first integrator;
   a second summing node coupled between the first integrator and the second integrator; and
   a local feedback loop coupled between the analog output node and said second summing node, wherein said local feedback loop comprises a first quantizer coupled in series with a first reference voltage selector.

2. The delta-sigma modulator as recited in claim 1, further comprising a multiple order feedback loop coupled between the analog output node and said first summing node, wherein said multiple order feedback loop comprises a second quantizer coupled in series with a second reference voltage selector.

3. The delta-sigma modulator as recited in claim 1, wherein said local feedback loop is coupled across said second integrator but not across the first integrator on which said analog input node is coupled.

4. The delta-sigma modulator as recited in claim 1, wherein said first quantizer is adapted to produce a digital signal having two possible logic levels.

5. The delta-sigma modulator as recited in claim 4, wherein said first reference voltage selector comprises a pair of switches which couple one of two reference voltages upon said second summing node in response to said two logic levels.

6. The delta-sigma modulator as recited in claim 1, wherein said first quantizer is adapted to produce a digital signal having three possible logic levels.

7. The delta-sigma modulator as recited in claim 6, wherein said first reference voltage selector comprises three switches which couple one of three reference voltages upon said second summing node in response to said three logic levels.

8. The delta-sigma modulator as recited in claim 2, further comprising an interstage summing node coupled to the output of said analog output node and the output of said second reference voltage selector.

9. The delta-sigma modulator as recited in claim 8, wherein said interstage summing node comprises an amplifier having an amplified output with a scaling factor less than one.

10. The delta-sigma modulator as recited in claim 8, wherein said interstage summing node comprises an amplifier coupled to scale the output of said second reference voltage selector necessary to cause said interstage summing node to produce only quantization noise from said second quantizer less data from said second integrator.

11. The delta-sigma modulator as recited in claim 8, wherein said interstage summing node comprises an amplifier coupled to scale the output of said second reference voltage selector necessary to cause said interstage summing node to produce only data from said second integrator less quantization noise from said second quantizer.

12. The delta-sigma modulator as recited in claim 8, wherein said interstage summing node comprises an amplifier coupled to scale the output of said second reference voltage selector necessary to cause said interstage summing node to produce both data from said second integrator and quantization noise from said second quantizer.

13. The delta-sigma modulator as recited in claim 1, further comprising a third integrator electrically coupled to an output of said first and second integrators, wherein said third integrator is embodied within a second stage, and wherein said first, second and third integrators comprise a cascaded 2:1 arrangement.

14. The delta-sigma modulator as recited in claim 1, further comprising:
third and fourth integrators electrically coupled to an output of said first and second integrators, wherein said third integrator is embodied within a first stage along with the first and second integrators, and wherein the fourth integrator is embodied within a second stage such that said first, second, third and fourth integrators comprise a cascaded 3:1 arrangement; and
another local feedback loop coupled across the output and input terminals of said third integrator.

15. The delta-sigma modulator as recited in claim 1, further comprising third and fourth integrators electrically coupled to an output of said first and second integrators, wherein said third and fourth integrators are embodied within a second stage, and wherein said first, second, third and fourth integrators comprise a cascaded 2:2 arrangement.

16. The delta-sigma modulator as recited in claim 8, further comprising:
a third summing node coupled to the output of said interstage summing node; and
at least one third integrator coupled to the output of said third summing node.

17. The delta-sigma modulator as recited in claim 16, further comprising a third quantizer coupled to the output of said at least one third integrator.

18. The delta-sigma modulator as recited in claim 16, wherein said third summing node and said at least one third integrator comprises a second stage of a cascaded said delta-sigma modulator.

19. The delta-sigma modulator as recited in claim 17, further comprising a noise cancellation circuit coupled to receive the output of said first quantizer, the output of said second quantizer and the output of said third quantizer and, upon receipt of said outputs, said noise cancellation circuit is adapted to produce a digital signal which increases linearly in response to a linear increase in an analog input signal placed upon said analog input node.

20. The delta-sigma modulator as recited in claim 19, wherein the linearity of said digital signal is maintained up to and beyond a full scale peak value of said analog input signal.

21. The delta-sigma modulator as recited in claim 19, wherein the linearity of said digital signal is measured as a signal-to-noise level plotted as a function of the analog input signal level.

22. A multiple order, cascaded analog-to-digital converter, comprising:
a first stage of at least two primary integrators coupled in series between an analog input node and a first analog output node;
at least one local feedback loop, each local feedback loop is coupled across a respective said primary integrator;
a second stage of at least one secondary integrator electrically coupled between said first analog output node and a second analog output node; and
a noise cancellation circuit coupled to receive during use a quantized signal forwarded from said local feedback loop, forwarded from said first analog output node and forwarded from said second analog output node.

23. The multiple order, cascaded analog-to-digital converter as recited in claim 22, wherein said local feedback loop is coupled across a respective said primary integrator except for the primary integrator on which said analog input node is coupled.

24. The multiple order, cascaded analog-to-digital converter as recited in claim 22, wherein the quantized signal forwarded from said local feedback loop, said first analog output node and said second analog output node is produced from respective oversampling quantizers.

25. The multiple order, cascaded analog-to-digital converter as recited in claim 22, wherein said noise cancellation circuit comprises:
a differentiator circuit coupled to receive the quantized signal forwarded from said local feedback loop;
a primary noise shaping summing node coupled to receive the quantized signals forwarded from said first and second analog output nodes;
a series-connected pair of differentiating circuits coupled to receive the output of said primary noise shaping summing node;
a series-connected pair of delay circuits coupled to the output of said differentiator circuit; and
a secondary noise shaping summing node coupled to receive the output of said second series of delay circuits and the output of said pair of differentiating circuits and, upon receipt of said outputs, for producing a digital code which represents an analog signal placed upon the analog input node.

26. The multiple order, cascaded analog-to-digital converter as recited in claim 22, wherein said digital code comprises a series of logic ones which increase relative to logic zeros substantially proportional to a level increase in said analog signal, and wherein said increase is substantially linear with respect to said analog signal level increase.

27. The multiple order, cascaded analog-to-digital converter as recited in claim 26, wherein said linear increase extends from a minimum analog signal level to a maximum analog signal level.

28. The multiple order, cascaded analog-to-digital converter as recited in claim 22, further comprising an interstage summing node coupled between said first and second stages, said interstage summing node having an amplified output with a scaling factor less than one.

29. The multiple order, cascaded analog-to-digital converter as recited in claim 22, further comprising an interstage summing node coupled between said first and second stages, said interstage summing node having a pair of amplified inputs configured to produce data less quantized noise at the output of said summing node.

30. The multiple order, cascaded analog-to-digital converter as recited in claim 22, further comprising a capacitor coupled to sample input upon one of said primary integrators and to sample a selected reference voltage of said local feedback loop.

31. A method for minimizing decrease in signal-to-noise level of a digital code output from a cascaded analog-to-digital converter, comprising:

providing multiple order, series-connected integrators for integrating an analog input signal to produce an integrated analog output signal;

first quantizing the integrated analog output signal;

feeding back the first quantized analog output signal to a local feedback switching circuit coupled at the input of one of said series-connected integrators;

second quantizing the integrated analog output signal;

feeding back the second quantized analog output signal to a multiple order feedback switching circuit coupled at the input of the multiple order integrators;

feeding forward the integrated analog output signal to an interstage summing node configured between said series-connected integrators and a third integrator, while further feeding forward the first quantized analog output signal to a noise cancellation circuit;

integrating the output of the interstage summing node with said third integrator and thereafter quantizing the third integrator output; and feeding forward the quantized output of said third integrator to said noise cancellation circuit.

32. The method as recited in claim 31, wherein said first quantizing step comprises oversampling the integrated analog output signal into a three level digital code.

33. The method as recited in claim 31, wherein said local feedback switching circuit comprises three switches configured to respectively receive the three level digital code.

34. The method as recited in claim 31, further comprising cancelling noise within the oversampled analog output signal by said noise cancellation circuit.

* * * * *